(12) United States Patent
Nomura et al.

(10) Patent No.: US 7,861,731 B2
(45) Date of Patent: Jan. 4, 2011

(54) CLEANING/DRYING APPARATUS AND CLEANING/DRYING METHOD

(75) Inventors: Michinao Nomura, Kawasaki (JP);
Mitsuru Kubo, Kawasaki (JP); Chujiro Fukasawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 12/186,221

(22) Filed: Aug. 5, 2008

(65) Prior Publication Data
US 2009/0084415 A1 Apr. 2, 2009

(30) Foreign Application Priority Data
Oct. 1, 2007 (JP) .............................. 2007-258077

(51) Int. Cl.
*B08B 3/02* (2006.01)
*F26B 21/10* (2006.01)
*F26B 21/12* (2006.01)

(52) U.S. Cl. .................. 134/95.2; 134/95.3; 134/103.2; 134/135; 134/137; 134/198; 134/200; 134/902; 34/73; 34/74

(58) Field of Classification Search ................ 134/95.2, 134/95.3, 91.1, 102.3, 103.2, 135, 137, 902; 34/73, 74, 575, 446, 447
See application file for complete search history.

(56) References Cited

U.S. PATENT DOCUMENTS

| | | | |
|---|---|---|---|
| 5,331,987 A | | 7/1994 | Hayashi et al. |
| 5,657,553 A | * | 8/1997 | Tarui et al. ...................... 34/78 |
| 5,950,328 A | | 9/1999 | Ichiko et al. |
| 6,128,830 A | * | 10/2000 | Bettcher et al. ............... 34/404 |
| 6,158,141 A | * | 12/2000 | Asada et al. .................... 34/74 |
| 6,649,883 B2 | * | 11/2003 | Iwamoto et al. .............. 219/494 |
| 7,581,335 B2 | * | 9/2009 | Tanaka et al. .................. 34/391 |

FOREIGN PATENT DOCUMENTS

| | | | |
|---|---|---|---|
| JP | 59-215729 | A | 12/1984 |
| JP | 05-144797 | A | 6/1993 |
| JP | 06-053203 | A | 2/1994 |
| JP | 06-120197 | A | 4/1994 |
| JP | 06-181198 | A | 6/1994 |
| JP | 06-196471 | A | 7/1994 |
| JP | 06-275596 | A | 9/1994 |
| JP | 07-159980 | A | 6/1995 |
| JP | 08-241881 | A | 9/1996 |
| JP | 2639771 | B | 5/1997 |
| JP | 11-40536 | A | 2/1999 |

* cited by examiner

*Primary Examiner*—Michael Barr
*Assistant Examiner*—Saeed T Chaudhry
(74) *Attorney, Agent, or Firm*—Westerman, Hattori, Daniels & Adrian, LLP

(57) ABSTRACT

A cleaning/drying apparatus including a vapor area where vapor of an organic solvent inside the cleaning/drying apparatus is generated, an ejecting part configured to eject the organic solvent onto a cleaning/drying target, a first detecting part configured to determine whether the temperature of the cleaning/drying target is a first temperature equivalent to a temperature of the vapor in the vapor area, a second detecting part configured to determine whether the temperature of the cleaning/drying target is a second temperature enabling the organic solvent to condense on a surface of the cleaning/drying target, and a cleaning/drying control part configured to drive the ejecting part to eject the organic solvent when the first detecting part detects that the temperature of the cleaning/drying target is the first temperature and stop the ejection when the second detecting part detects that the temperature of the cleaning/drying target is the second temperature.

9 Claims, 18 Drawing Sheets

FIG.18

VALUES MEASURED BY PARTICLE COUNTER BEFORE/AFTER VAPOR DRYING
(EQUAL TO OR GREATER THAN 0.2 μm)

|  | BEFORE DRYING (A) | AFTER DRYING (B) | B−A |
|---|---|---|---|
| VAPOR DRYING MACHINE OF RELATED ART EXAMPLE | 492 | 501 | 9 |
| CLEANING/DRYING APPARATUS ACCORDING TO EMBODIMENT OF PRESENT INVENTION | 545 | 379 | −166 |

CLEANING/DRYING APPARATUS AND CLEANING/DRYING METHOD

BACKGROUND OF THE INVENTION

1. Field of the Invention

The present invention generally relates to a cleaning/drying apparatus and a cleaning/drying method, and more particularly to a cleaning/drying apparatus and a cleaning/drying method for cleaning and drying a cleaning/drying target by positioning the cleaning/drying target in a vapor area of an organic solvent.

2. Description of the Related Art

Typically, in manufacturing an electronic component (e.g., wafer, magnetic head), wet cleaning is performed in between the manufacturing processes by using, for example, an ultrasonic cleaning apparatus for removing materials (e.g., adhesive agent) adhered to the electronic component during the manufacturing process. After the wet cleaning, an installing case containing the electronic component is placed in a cleaning/drying apparatus for drying the surface of the electronic component (see, for example, Japanese Laid-Open Patent Application No. 11-040536).

FIG. 1 is a schematic diagram showing a cleaning/drying apparatus 1 (referred to as "vapor drying machine") according to a related art example (as shown in Japanese Laid-Open Patent Application No. 11-040536). The vapor drying machine 1 includes a main body (drying tub) 2 forming the outer body of the vapor drying apparatus 1. Inside the main body, there is provided an elevating stage 8 for supporting an installing case 10 containing a cleaning/drying target (electronic component such as a wafer or a magnetic head) and a solvent discharging part 9 for collecting a cleaning liquid such as water replaced by an organic solvent on the surface of the installing case 10.

FIG. 2 is a schematic diagram showing the installing case 10 used for a magnetic head. As shown in FIG. 2, the magnetic head is configured as a row bar 11 so that plural magnetic heads can be installed inside the installing case 10. The installing case 10 is shaped as a frame. Each row bar 11 is held at both ends of the installing case 10 (upper and lower ends in FIG. 2). The portion of the row bar 11 between the ends is not covered (i.e. exposed) by the installing case 10. This allows organic solvent to condense on the surface of the row bar (magnetic head) 11 as described below.

An organic solvent 3 is provided at a lower part of the main body 2. The main body 2 also has a heater 4 provided below the organic solvent 3. By heating with the heater 4, the organic solvent 3 evaporates to form a vapor area 5. A cooling pipe 6 configured as a corrugated tube is provided at an upper inner side of the main body 2 for circulating cooling water. By circulating cooling water inside the cooling pipe 6, a cooling area 7 can be formed. The vapor of the heated organic solvent 3 heated by the heater 4 is cooled and falls as droplets after becoming a liquid. This prevents vapor from being released from the main body 2.

With the above-described vapor drying apparatus 1 according to the related art example, when the installing case 10 having a low temperature is placed into the main body 2 filled with high temperature vapor of an organic solvent, the organic solvent condenses on the surface of the electronic device installed inside the installing case 10; thereby the organic solvent can flow off from the surface together with stains on the surface of the electronic device. Thereby, the surface of the electronic device is cleaned. Then, when the installing case 10 reaches the same temperature as the vapor, the organic solvent on the surface of the installing case 10 evaporates, to thereby dry the surface of the electronic device.

However, with the above-described cleaning/drying method, there is a possibility that stains on the surface of the installing case 10 may still remain when the organic solvent flows off from the surface. From the aspect of cleaning efficiency, the surface of the electronic device cannot be sufficiently cleaned with the method of cleaning the surface of the electronic device by allowing the condensed organic solvent to flow off from its surface.

SUMMARY OF THE INVENTION

The present invention may provide a cleaning/drying apparatus and a cleaning/drying method that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a cleaning/drying apparatus and a cleaning/drying method particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the invention provides a cleaning/drying apparatus including a vapor area where vapor of an organic solvent inside the cleaning/drying apparatus is generated, an ejecting part configured to eject the organic solvent onto a cleaning/drying target, a first detecting part configured to determine whether the temperature of the cleaning/drying target is a first temperature equivalent to a temperature of the vapor in the vapor area, a second detecting part configured to determine whether the temperature of the cleaning/drying target is a second temperature enabling the organic solvent to condense on a surface of the cleaning/drying target, and a cleaning/drying control part configured to drive the ejecting part to eject the organic solvent when the first detecting part detects that the temperature of the cleaning/drying target is the first temperature and stop the ejection when the second detecting part detects that the temperature of the cleaning/drying target is the second temperature.

Another embodiment of the present invention provides a cleaning/drying method including the steps of: a) ejecting an organic solvent onto a cleaning/drying target positioned inside a vapor area where vapor is generated when a temperature of the cleaning/drying target reaches a first temperature equal to a temperature inside the vapor area; b) stopping the ejection of step a) when the temperature of the cleaning/drying target reaches a second temperature enabling the organic solvent to condense on a surface of the cleaning/drying target; c) moving the cleaning/drying target out of the vapor area when the temperature of the cleaning/drying target reaches the first temperature.

Other objects and further features of the present invention will be apparent from the following detailed description when read in conjunction with the accompanying drawings.

BRIEF DESCRIPTION OF THE DRAWINGS

FIG. 18 is a table for describing a cleaning performance (cleaning effect) of a cleaning/drying apparatus according to an embodiment of the present invention.

DESCRIPTION OF THE PREFERRED EMBODIMENTS

In the following, embodiments of the present invention will be described with reference to the accompanying drawings.

Figure 3:
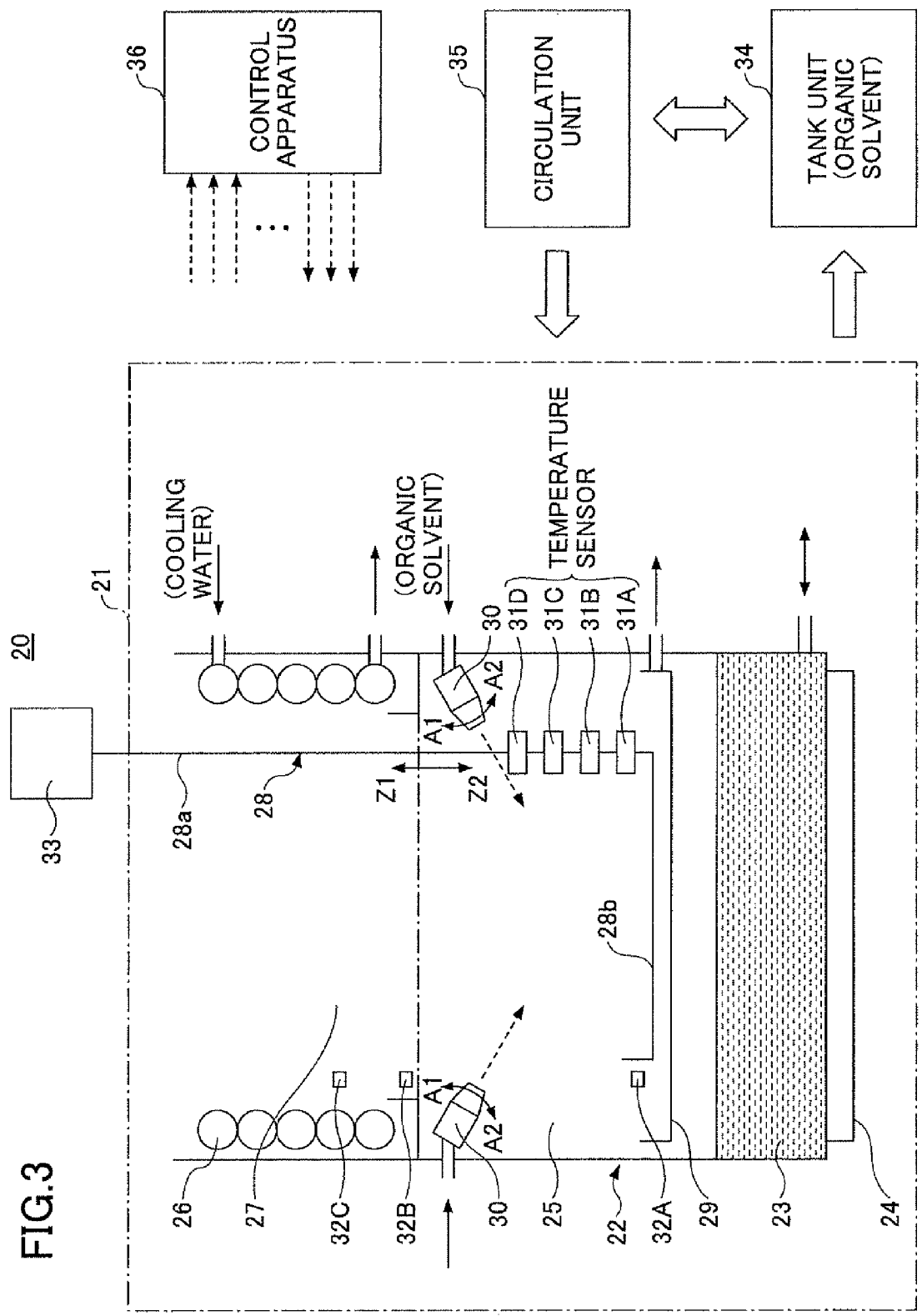
FIG. 3 shows a configuration of a cleaning/drying apparatus 20 according to an embodiment of the present invention.
Figure 4:
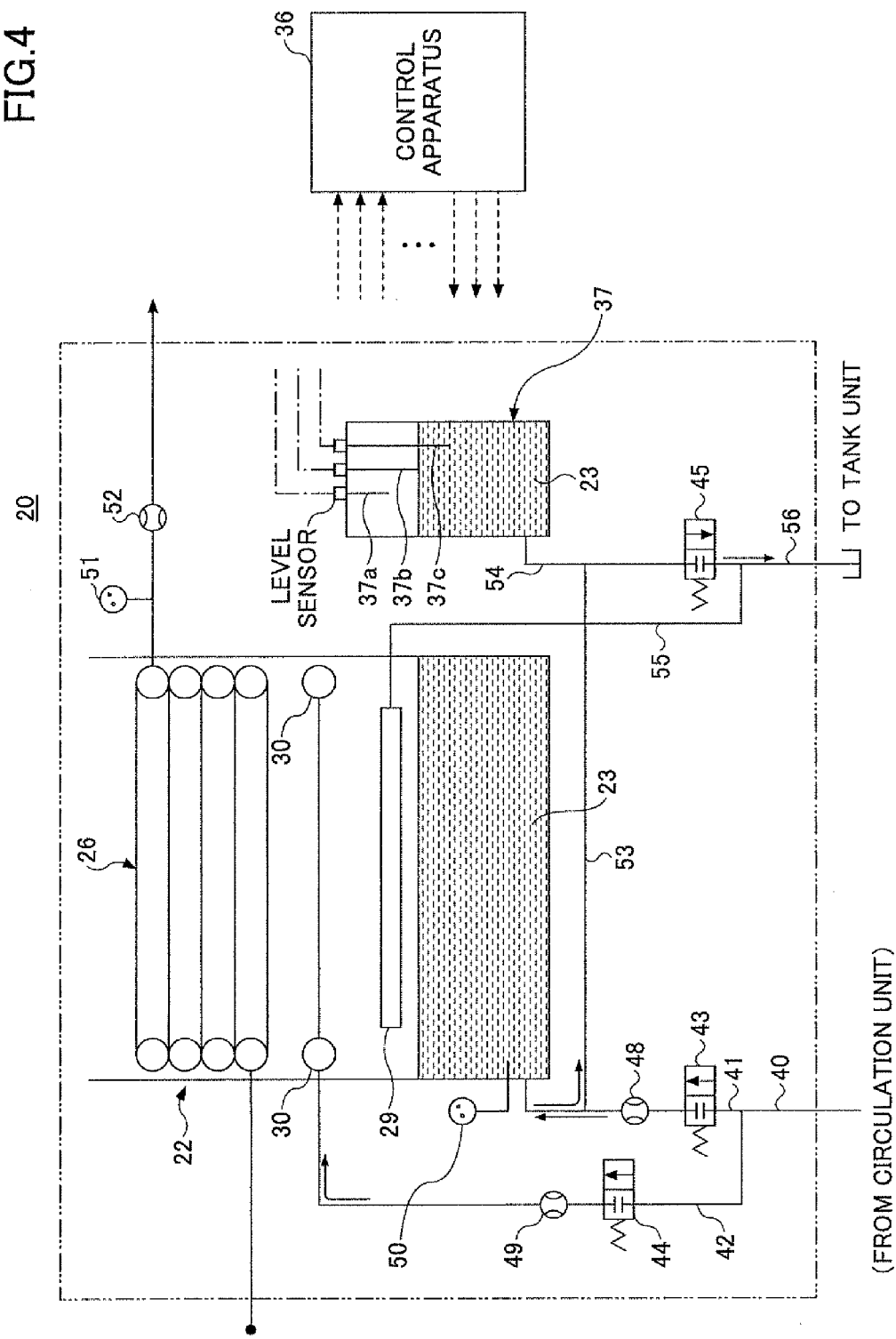
FIG. 4 shows pipelines of a cleaning/drying apparatus according to an embodiment of the present invention.
Figure 5:
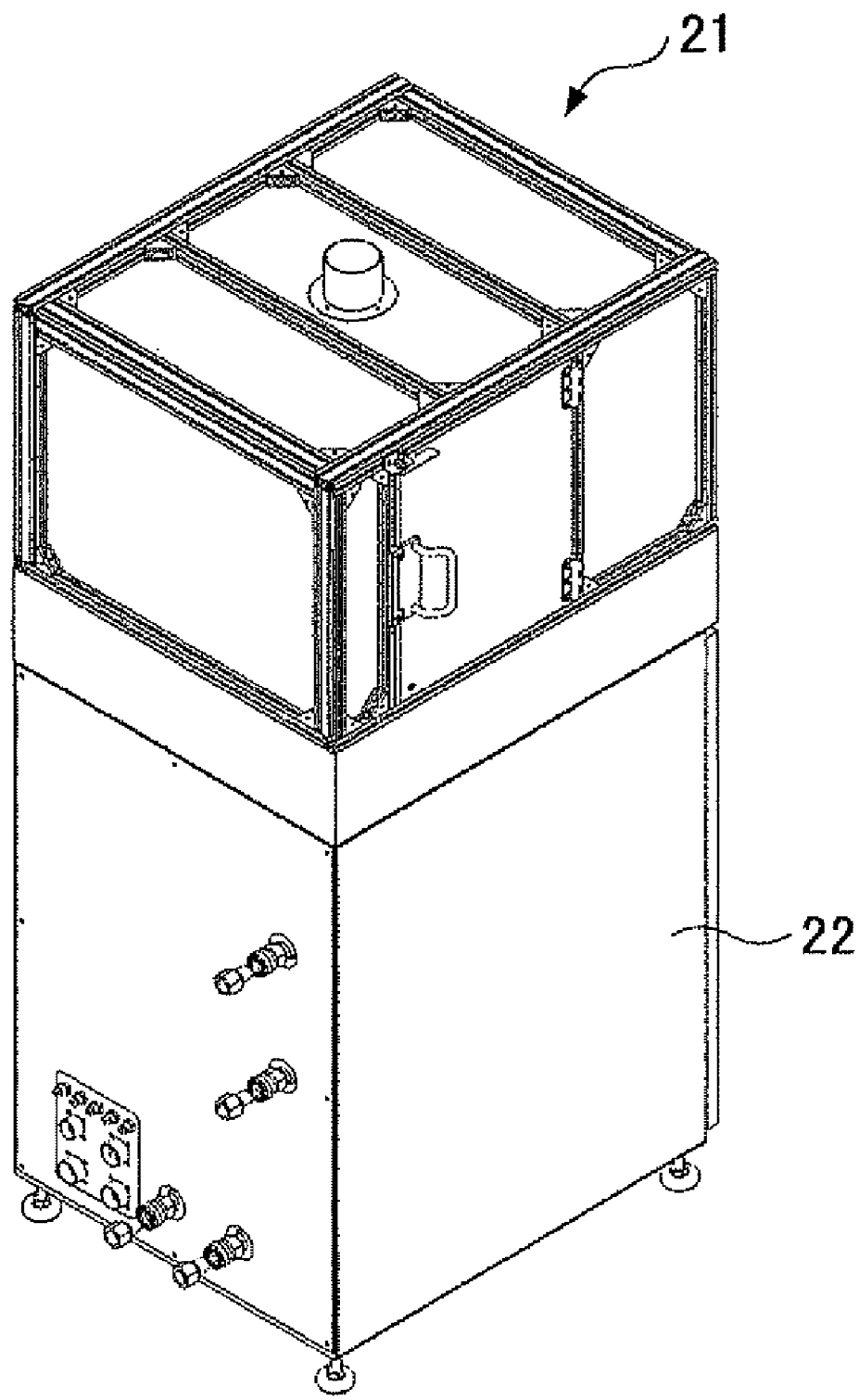
FIG. 5 shows the exterior of a main body of a cleaning/drying apparatus according to an embodiment of the present invention.
Figure 6:
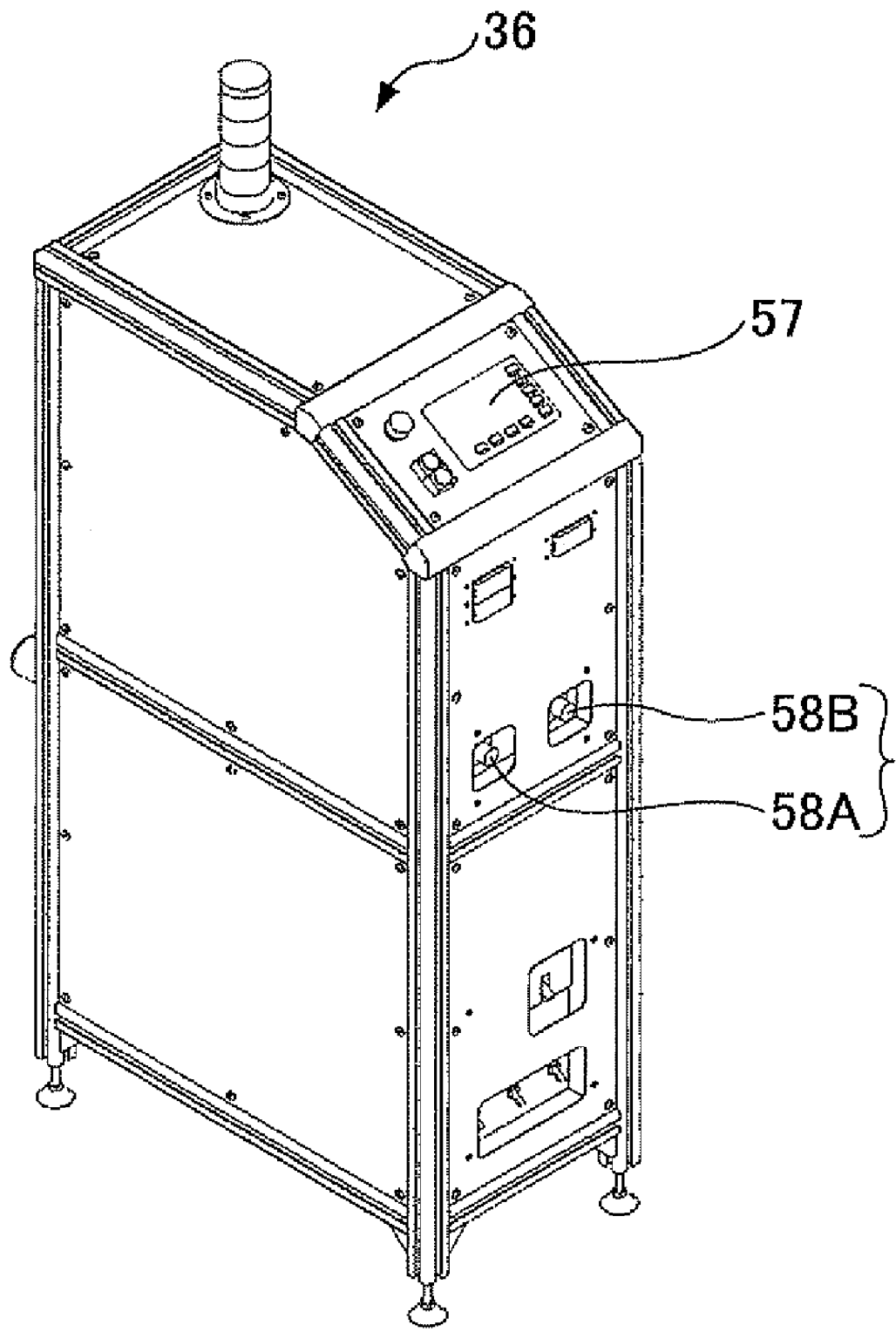
FIG. 6 shows the exterior of a control apparatus according to an embodiment of the present invention.
Figure 7:
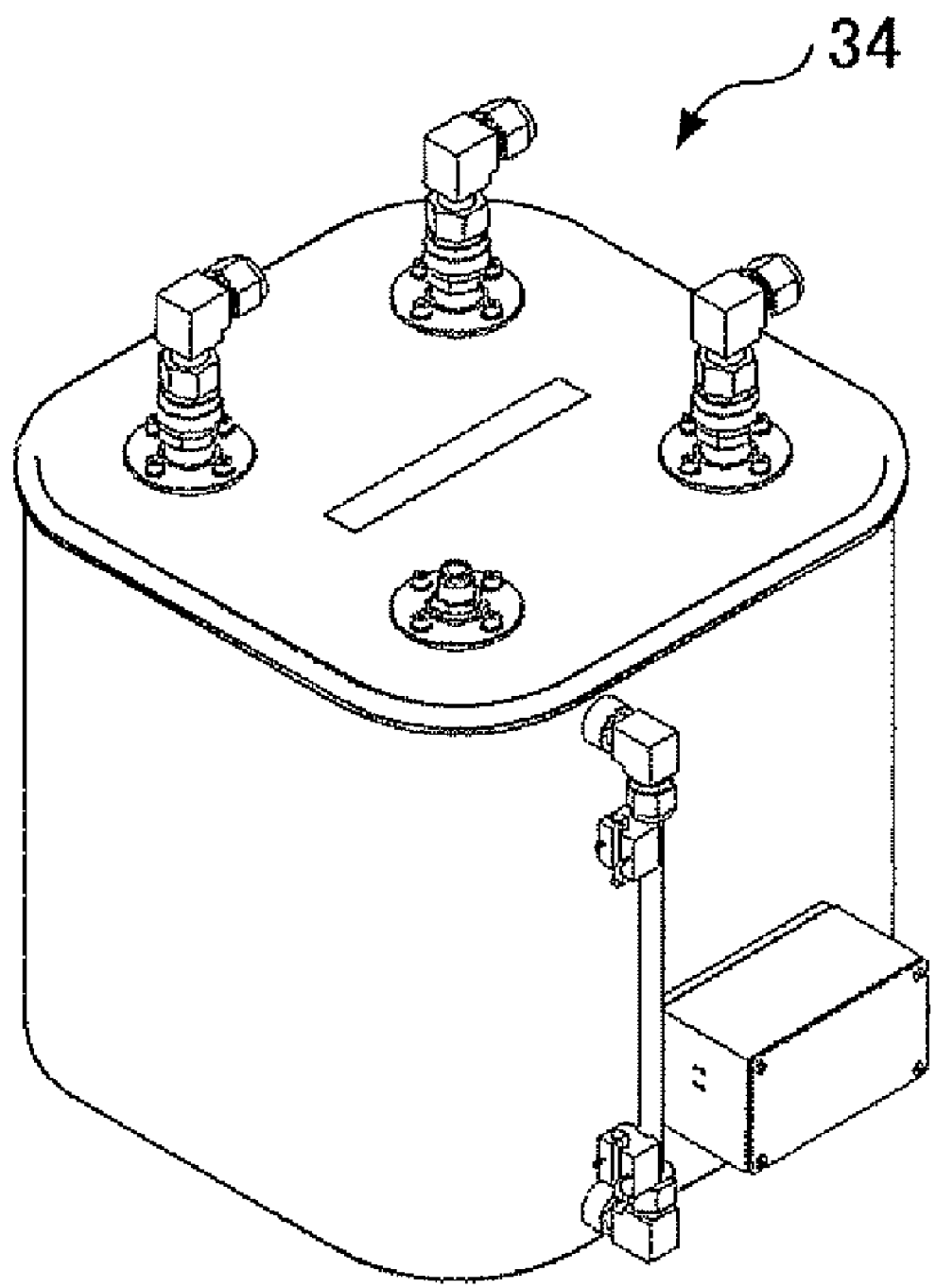
FIG. 7 shows the exterior of a tank unit according to an embodiment of the present invention.

FIGS. 3 through 7 are schematic diagrams for describing an overall configuration of a cleaning/drying apparatus 20 according to an embodiment of the present invention. FIG. 3 shows a configuration of the cleaning/drying apparatus 20 according to an embodiment of the present invention. FIG. 4 shows pipelines of the cleaning/drying apparatus 20 according to an embodiment of the present invention. FIG. 5 shows the exterior of a main body 21 of the cleaning/drying apparatus 20 according to an embodiment of the present invention. FIG. 6 shows the exterior of a control apparatus according to an embodiment of the present invention. FIG. 7 shows the exterior of a tank unit 34 according to an embodiment of the present invention.

First, the configuration of the cleaning/drying apparatus 20 is described with reference to FIG. 3. The cleaning/drying apparatus 20 includes, for example, the main body 21, the tank unit 34, a circulation unit 35, and the control apparatus 36. The tank unit 34 shown in FIG. 7 is for storing an organic solvent 23 to be supplied to the main body 21. The circulation unit 35 is for circulating the organic solvent 23 between the main body 21 and the tank unit 34.

The main body 21 includes, for example, a cleaning/drying tank 22, a heater 24, cooling tubes 26, an elevation stage 28, a solvent collecting part 29, and ejection nozzles 30.

The cleaning/drying tank 22 shown in FIG. 5 is configured to store approximately 10 L (liters) of the organic solvent 23. In this embodiment of the present invention, isopropyl alcohol (IPA) is used as the organic solvent 23.

The heater 24 acting as a heating part is provided at the bottom of the cleaning/drying tank 22. The heater 24 includes a temperature sensor for monitoring heating temperature. The organic solvent 23 inside the cleaning/drying tank 22 is constantly heated by the heater 24. Thereby, vapor of the organic solvent 23 is generated. As a result, a vapor area 25 is formed in the cleaning/drying tank 22. The temperature in the vapor area 25 according to this embodiment of the present invention is approximately 80° C.

The elevation stage 28 is driven to move in a vertical direction (direction illustrated with arrows Z1, Z2 in FIG. 3) inside the cleaning/drying tank 22 by an elevation driving apparatus 33. The elevation stage 28 includes an arm part 28a connected to the elevation driving apparatus 33 and a stage part 28b into which an installing basket 70 (described in detail below, see FIG. 9) is placed.

The elevation driving apparatus 33 has, for example, a motor and a rack & pinion mechanism for converting the rotational motion of the motor to linear motion (not shown). The arm part 28a of the elevation stage 28 is connected to the rack & pinion mechanism. Thereby, the stage part 28b is allowed to move upward and downward (elevation operation) by the elevation driving apparatus 33.

As described in detail below, the installing basket 70 (shown in FIG. 9) is placed on the elevation stage 28. In this embodiment of the present invention, four temperature sensors 31A-31D are aligned a vertical direction (direction illustrated with arrows Z1, Z2 in FIG. 3) in the vicinity where the installing basket 70 is placed (positioned). The temperature sensors 31A-31D are for detecting temperature inside the vapor area 25. The temperature sensors 31A-31D are connected to the control apparatus 36. The control apparatus 36 obtains (derives) the distribution of temperature inside the vapor area 25 based on temperature detection signals from the temperature sensors 31A-31D.

The area of the temperature sensors 31A-31D is not limited to the elevation stage 28. The temperature sensors 31A-31D may be positioned in other areas as long as the temperature distribution in the vapor area 25 can be measured. For example, the temperature sensors 31A-31D may be directly mounted on the cleaning/drying tank 22.

The elevation stage 28 is configured to move between a positioning/collecting position and a cleaning/drying position. The positioning/collecting position is where the installing basket 70 is positioned (mounted) with respect to the elevation stage 28 or a position where the installing basket 70 is collected. The cleaning/drying position is where the cleaning or drying is performed on a cleaning/drying target installed (contained) in the installing basket 70. The positioning/collecting position is at an upper part of the cleaning/drying tank 22. The cleaning/drying position is set at a lower part of the cleaning/drying tank 22 which is in the vicinity of the organic solvent 23.

Thus, the elevation movement of the elevation stage 28 is to be stopped at the positioning/collecting position and the cleaning/drying position. Accordingly, a position sensor 32A is provided at the cleaning/drying position inside the cleaning/drying tank 22 and another position sensor 32C is provided at the positioning/collecting position inside the cleaning/drying tank 22. The position sensors 32A, 32C are connected to the control apparatus 36. Accordingly, the control apparatus 36 can determine whether the stage part 28b (installing basket 70) has reached the positioning/collecting position or the cleaning/drying position based on output signals from each of the position sensors 32A, 32C.

Furthermore, another position sensor 32B is provided between the position sensor 32A and the position sensor 32C. In a case where the elevation stage 28 is raised (moved upward), the speed of raising the elevation stage 28 (raising speed) is switched (described in detail below). The position sensor 32B is provided at the position where the raising speed is switched (speed switching position). The position sensor 32B is also connected to the control apparatus 36. Accordingly, the control apparatus 36 can determine whether the elevation stage 28 has reached the speed switching position.

The ejection nozzles 30 are for ejecting the organic solvent 23. The organic solvent 23 is supplied from the tank unit 34 to the ejection nozzles 30 by the circulation unit 35. In this embodiment of the present invention, two ejection nozzles 30 are provided facing other inside the cleaning/drying tank 22. However, the number of ejection nozzles 30 or the position of the ejection nozzles 30 is not limited to those described in this embodiment of the present invention.

Figure 10:
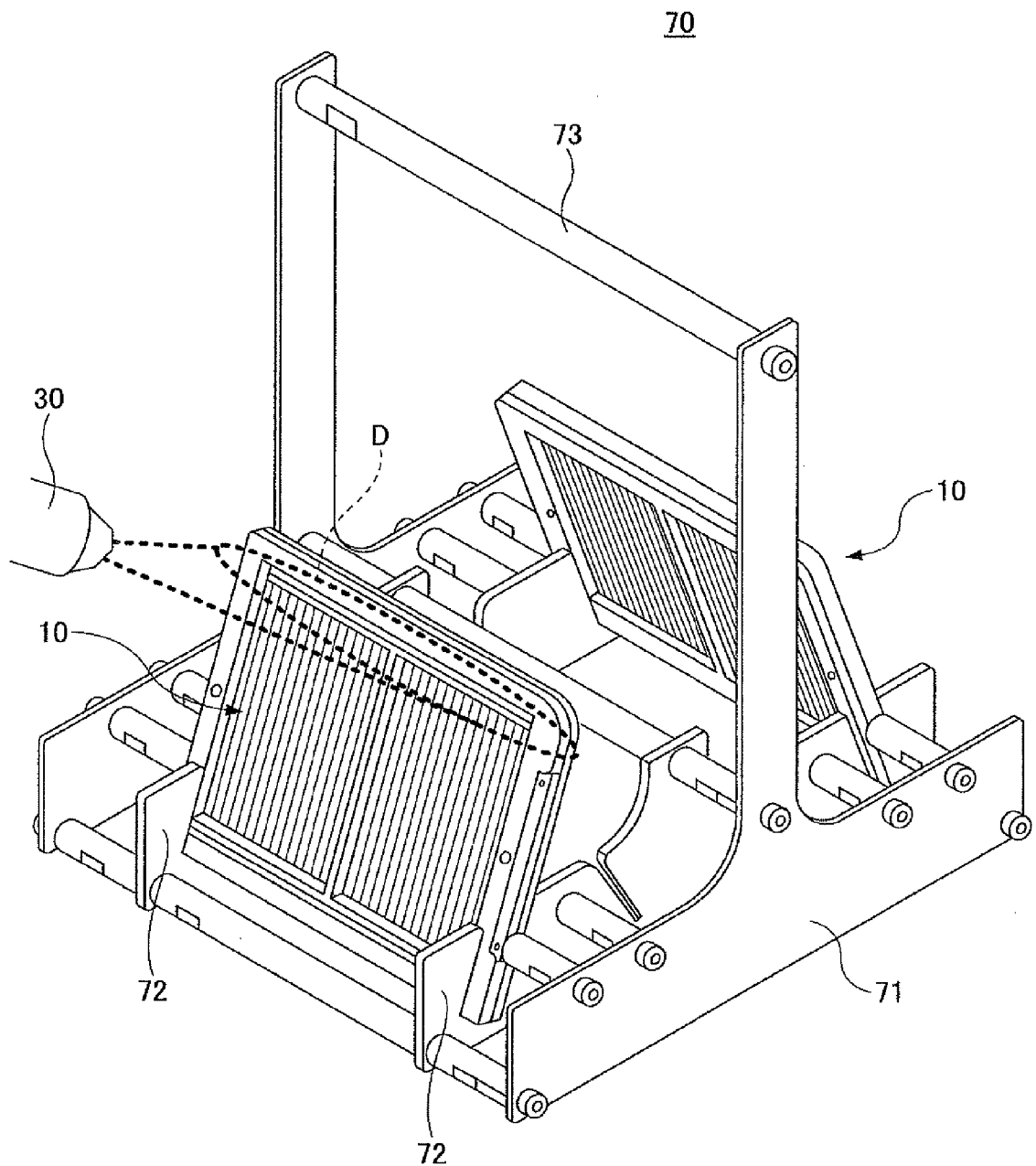
FIG. 10 is a schematic diagram showing a state where an ejection nozzle ejects an organic solvent to an installing basket mounted with an installing case according to an embodiment of the present invention.

The ejection nozzle 30 is configured to eject the organic solvent 23 onto the installing basket 70 when the elevation stage 28 is positioned at the cleaning/drying position. In this embodiment of the present invention, the ejection nozzle 30 has an ejection opening formed in a planar shape so that the ejected organic solvent 23 can be applied to a horizontal elliptic area on the surface of the installing case 10 (row bar 11) as shown in FIG. 10. Since the installing case 10 has a rectangular shape, the organic solvent 23 can be applied more efficiently onto the installing case 10 compared to applying the organic solvent 23 onto a round area.

Figure 8C:
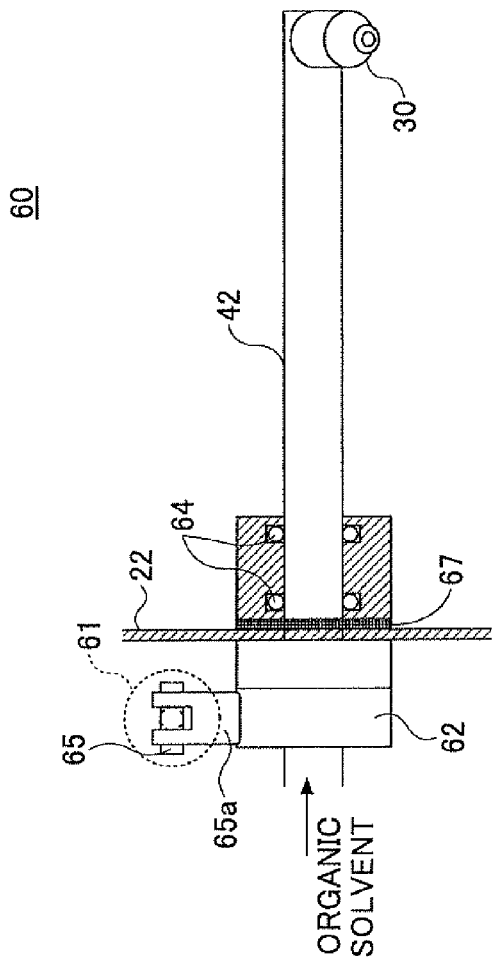
FIGS. 8A-8C are schematic views for describing a nozzle moving mechanism according to an embodiment of the present invention.
Figure 8A:
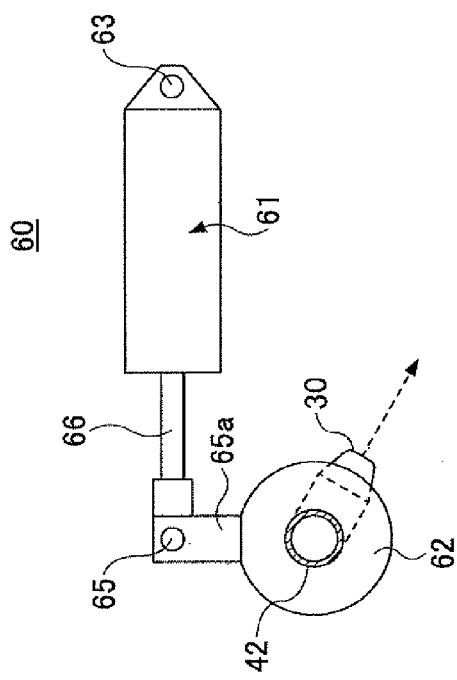
Figure 8B:
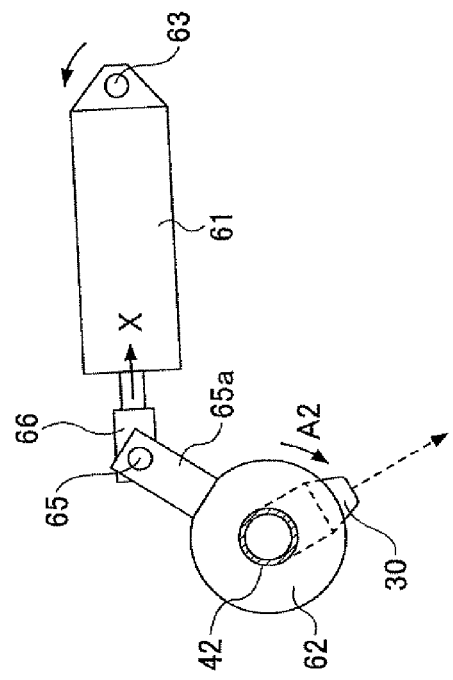

Furthermore, in order to increase ejection efficiency of the organic solvent 23 with respect to the installing basket 70, the ejection nozzle 30 is configured to move (rotate) in directions A1, A2 as shown in FIG. 3. A nozzle moving mechanism 60 that moves the ejection nozzle 30 according to an embodiment of the present invention is described with reference to FIGS. 8A-8C. FIG. 8A is a side view showing the nozzle moving mechanism 60. FIG. 8B is another side view for describing movement of the nozzle moving mechanism 60. FIG. 8C is a front view of the nozzle moving mechanism 60.

The nozzle moving mechanism 60 includes, for example, a cylinder 61, a rotating block 62, and a coupling part 65. A fulcrum 63, which is attached in the cleaning/drying tank 22, bears the cylinder 61 as shown at the right end of the cylinder 61 in FIG. 8A. The cylinder 61 is driven by the control apparatus 36. By driving the cylinder 61, the shaft 66 moves linearly.

The rotating block 62 is rotatably attached to the cleaning/drying tank 22. The rotating block 62 has an ejection pipe 42 concentrically fixed thereto in a manner penetrating the cleaning/drying tank 22. The ejection nozzle 30 is provided at an end part of the ejection pipe 42 toward the inner side of the cleaning/drying tank 22. The other end part of the ejection pipe 42 toward the outer side of the cleaning/drying tank 22 is connected to the circulation unit 35 from which the organic solvent 23 is supplied.

The rotating block 62 has an arm part 65a provided in a manner extending outward. The distal end of the arm part 65a is connected to a shaft 66 of the cylinder 61 via the coupling part 65. By driving the cylinder 61, the ejection pipe 42 is rotated via the rotating block 62. Accordingly, the ejection nozzles 30 move in directions A1, A2 as shown in FIG. 3. For example, when the shaft 66 of the cylinder 61 is moved in the X direction, the rotating block 62 rotates around the ejection pipe 42 as the center in a clockwise direction via the coupling part 65 as shown in FIG. 8A. Accordingly, the ejection nozzles 30 move (rotate) in direction A2.

Thus, by forming the ejection opening of the ejection nozzle 30 into a suitable shape, the organic solvent 23 can be applied onto a horizontal elliptic area of the installing case 10 (row bar 11). Furthermore, by enabling the ejection nozzles 30 to rotate in the A1, A2 directions, the organic solvent 23 can be efficiently ejected on the installing case 10 (row bar 11).

An O ring 64 and packing 67 are provided in the area where the ejection pipe 42 penetrates the cleaning/drying tank 22. This prevents vapor of the organic solvent 23 from escaping out of the main body 21.

The cleaning/drying apparatus 20 is further described with reference to FIG. 3. The solvent collecting part 29 is provided below the above-described cleaning/drying position and above the level surface of the organic solvent 23. The solvent collecting part 29 is for collecting the organic solvent 23 falling from the installing basket 70 (row bar 11) and the organic solvent 23 ejected from the ejection nozzles 30 during a cleaning/drying operation. The collected organic solvent 23 is returned to the tank unit 34 after being purified.

The cooling tubes 26 are provided above the ejection nozzles 30 inside the cleaning/drying tank 22. The cooling tubes 26 are constantly supplied with cooling water from a cooling water supplying apparatus (not shown). Accordingly, a cooling area 27 is formed in the area where the cooling tubes 26 are provided. The vaporized organic solvent 23 liquefies and falls below in the cooling area 27. This prevents the vapor of the organic solvent 23 from escaping out of the cleaning/drying tank 22; to thereby prevent reduction of the organic solvent 23.

The control apparatus 36 is connected to various sensors 31A-31D, 32A-32C and sensors provided to a below-described pipeline. The control apparatus 36 performs various controls for cleaning and drying based on signals from the sensors. FIG. 6 shows the exterior of the cleaning/drying apparatus according to an embodiment of the present invention. The control apparatus 36 includes, for example, an input panel 57, and a speed input switch 58A, 58B.

Figure 9:
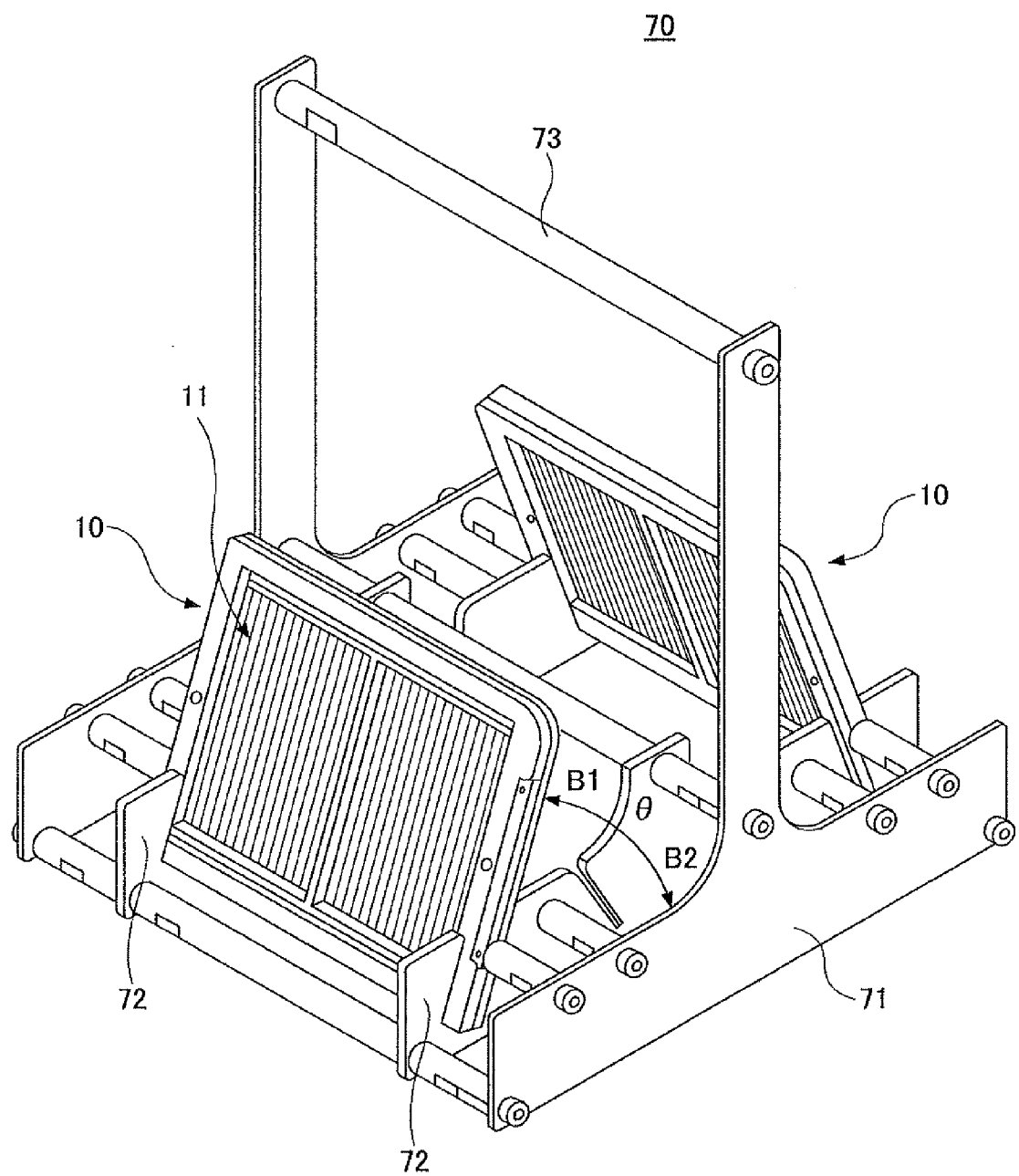
FIG. 9 is a perspective view showing an installing basket according to an embodiment of the present invention.

Next, the installing basket 70 for containing the row bar 11 (cleaning/drying target) is described. FIG. 9 is a perspective view showing the installing basket 70 according to an embodiment of the present invention. The installing basket 70 includes, for example, a basket main body 71, a case mounting part 72, and a holding part 73.

Figure 1:
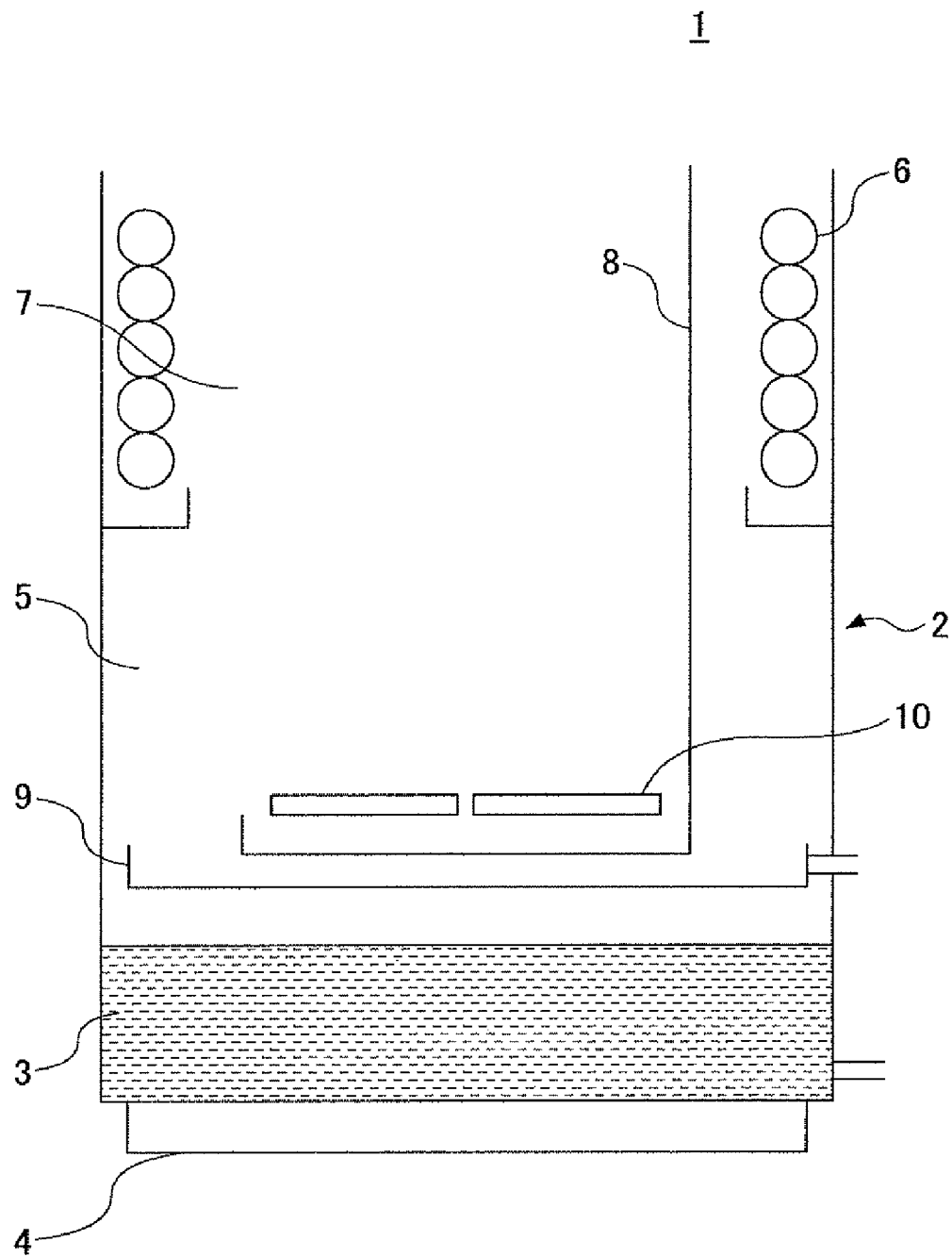
FIG. 1 is a schematic diagram showing a vapor drying machine 1 according to a related art example.
Figure 2:
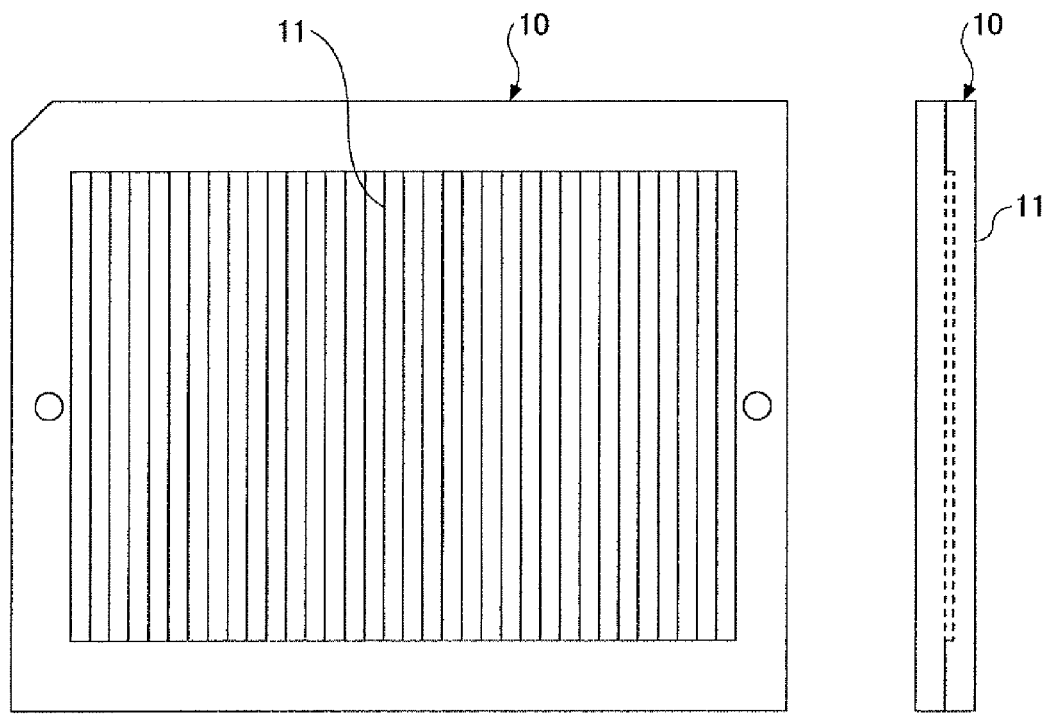
FIG. 2 is a schematic diagram showing an installing case which is to be a cleaning/drying target.

The basket main body 71 is the part of the installing basket 70 that is placed on the stage part 28b of the elevation stage 28. The basket main body 71 according to this embodiment of the present invention is configured to mount two installing cases 10. As described above with reference to FIG. 2, the installing case 10 is shaped as a frame having plural stick-like row bars are arranged therein. Each row bar 11 is held (supported) at both end parts of the frame-shaped installing case 10. The row bars 11 are held in an exposed manner at an area between the end parts.

The row bar 11 is an array of plural magnetic head devices of a wafer. By dicing the magnetic head devices, magnetic heads can be separately fabricated.

The case mounting part 72 is provided to the basket main body 71 for mounting the installing case 10. The case mounting part 72 is configured to allow the installing case 10 to be mounted on the basket main body 71 at a discretionary angle θ. The angle for mounting the installing case 10 according to this embodiment of the present invention is 70 degrees. Since the installing case 10 can be mounted at a discretional angle, the organic solvent 23 ejected from the ejection nozzles 30 can be applied to the row bars 11 (e.g., magnetic head) in a substantially perpendicular angle. This improves cleaning efficiency.

The holding part 73 is for allowing an operator (user) to attach or detach the installing basket 70 with respect to the elevation stage 28. By providing the holding part 73, the time and workload for mounting the installing basket 70 to the elevation stage 28.

Next, a pipeline of the cleaning/drying apparatus according to an embodiment of the present invention is described with reference to FIG. 4.

A supply pipe 40 has an end connected to the circulation unit 35 at an upstream side with respect to the flow of the organic solvent 23 (hereinafter simply referred to as "upstream side") and has another end connected to a lower part of the cleaning/drying tank 22 for storing the organic solvent 23 at a downstream side with respect to the flow of the organic solvent 23 (hereinafter simply referred to as "downstream side"). The organic solvent 23 stored in the tank unit 34 is supplied from the circulation unit 35 to the supply pipe 40.

The supply pipe 40 branches to a supplementary pipe 41 and an ejection pipe 42. The supplementary pipe 41 is provided with a valve 43 and a flow rate sensor 48 where the valve 43 is situated upstream of the flow rate sensor 48. The valve 43 is an electromagnetic valve driven by controls of the control apparatus 36. The flow rate sensor 48 is for detecting the flow rate of the organic solvent 23 flowing in the supply pipe 40 when the valve 43 is open. A communicating pipe 53 serving as a branching pipe is provided between a connecting position (joint) of the supply pipe 40 and the cleaning/drying tank 22 and the flow rate sensor 48. The communicating pipe 53 is connected to a level sensor pipe 54 described below.

The ejection pipe 42 has the ejection nozzle 30 provided to its end part toward the downstream side. The ejection pipe 42 also has a valve 44 and a flow rate sensor 49 provided to a midway section before reaching the ejection nozzle 30. The valve 44 is an electromagnetic valve driven by controls of the control apparatus 36. The flow rate sensor 49 is for detecting the flow rate of the organic solvent 23 ejected from the ejection nozzle 30 when the valve 44 is open. It is to be noted that the valves 43, 44 are constantly closed. Thus, supplying of the organic solvent 23 from the circulation unit 35 to the supplementary pipe 41 or the ejection pipe 42 is stopped until a valve opening signal is sent from the control apparatus 36.

The level sensor pipe 54 and a collecting pipe 55 are connected to form a discharge pipe 56. The tank unit 34 is connected to a downstream side of an end part of the discharge pipe 56. A level sensor 37 is provided at an upstream side of the level sensor pipe 54.

A valve 45 is provided between a connecting position (joint) between the level sensor 37 of level sensor pipe 54 and the discharge pipe 56. The valve 45 is an electromagnetic valve driven by controls of the control apparatus 36. The valve 45 is a constantly closed. Thus, the organic solvent 23 stored in the cleaning/drying tank 22 is not discharged from the main body 21 until a valve opening signal is sent from the control apparatus 36.

The level sensor 37 is for detecting the level of the organic solvent 23 stored at a bottom part of the cleaning/drying tank 22. The cleaning/drying tank 22 and the organic solvent 23 are in communication via the communicating pipe 53 in a state where the valves 43, 45 are closed. Therefore, the height of the level of the organic solvent 23 in the level sensor 37 is substantially equal to the height of the organic solvent 23 in the cleaning/drying tank 22.

The level sensor 37 includes detecting parts 37a-37c provided at different level detecting positions. The detecting parts 37a-37c are connected to the control apparatus 36. Thereby, the control apparatus 36 can determine (detect) the height of the level of the organic solvent 23 in the cleaning/drying tank 22 according to detection signals from the level sensor 37 (detecting parts 37a-37c). That is, the control apparatus 36 can detect the amount of the organic solvent 23 stored in the cleaning/detecting tank 22.

A temperature sensor 50 is provided at a position where the organic solvent 23 is stored in the cleaning/drying tank 22. The temperature sensor 50 is for detecting the temperature of the organic solvent 23 stored in the cleaning/drying tank 22. The temperature of the organic solvent 23 detected by the temperature sensor 50 is sent to the control apparatus 36.

The cooling tubes 26 is connected to, for example, a cooling water supplying port of a magnetic head manufacturing factory at which the cleaning/drying apparatus 20 is installed. The cooling tubes 26 includes, for example, a temperature sensor 51 for monitoring the temperature of the cooling tubes 26 and a flow rate sensor 52 for monitoring the flow rate of the cooling water in the cooling tubes 26.

In the above-described cleaning/drying apparatus 20 both the valve 43 and the valve 44 are to be open when ejecting the organic solvent 23 from the ejection nozzle 30. Accordingly, the organic solvent 23, being supplied at high pressure from the circulation unit 35 to the supply pipe 40, is ejected from the ejection nozzle 30 via the ejection pipe 42.

In a case where reduction in the amount of organic solvent 23 stored in the cleaning/drying tank 22 is detected according to a level detection signal from the level sensor 37, the valves 44 and 45 are closed together with opening the valve 43. Thereby, the high pressure organic solvent 23, being supplied from the circulation unit 35 to the supply pipe 40, flows into the cleaning/drying tank 22 via the supplementary pipe 41. As a result, the amount of organic solvent 23 stored in the cleaning/drying tank 22 is increased.

On the other hand, in a case where an increase in the amount of organic solvent 23 stored in the cleaning/drying tank 22 is detected according to a level detection signal from the level sensor 37, the valves 43 and 44 are closed together with opening the valve 45. Thereby, the organic solvent 23, being stored in the cleaning/drying tank 22, is discharged to the tank unit 34 via the communicating pipe 53 and the discharge pipe 56. As a result, the amount of organic solvent 23 stored in the cleaning/drying tank 22 is reduced.

Figure 15:
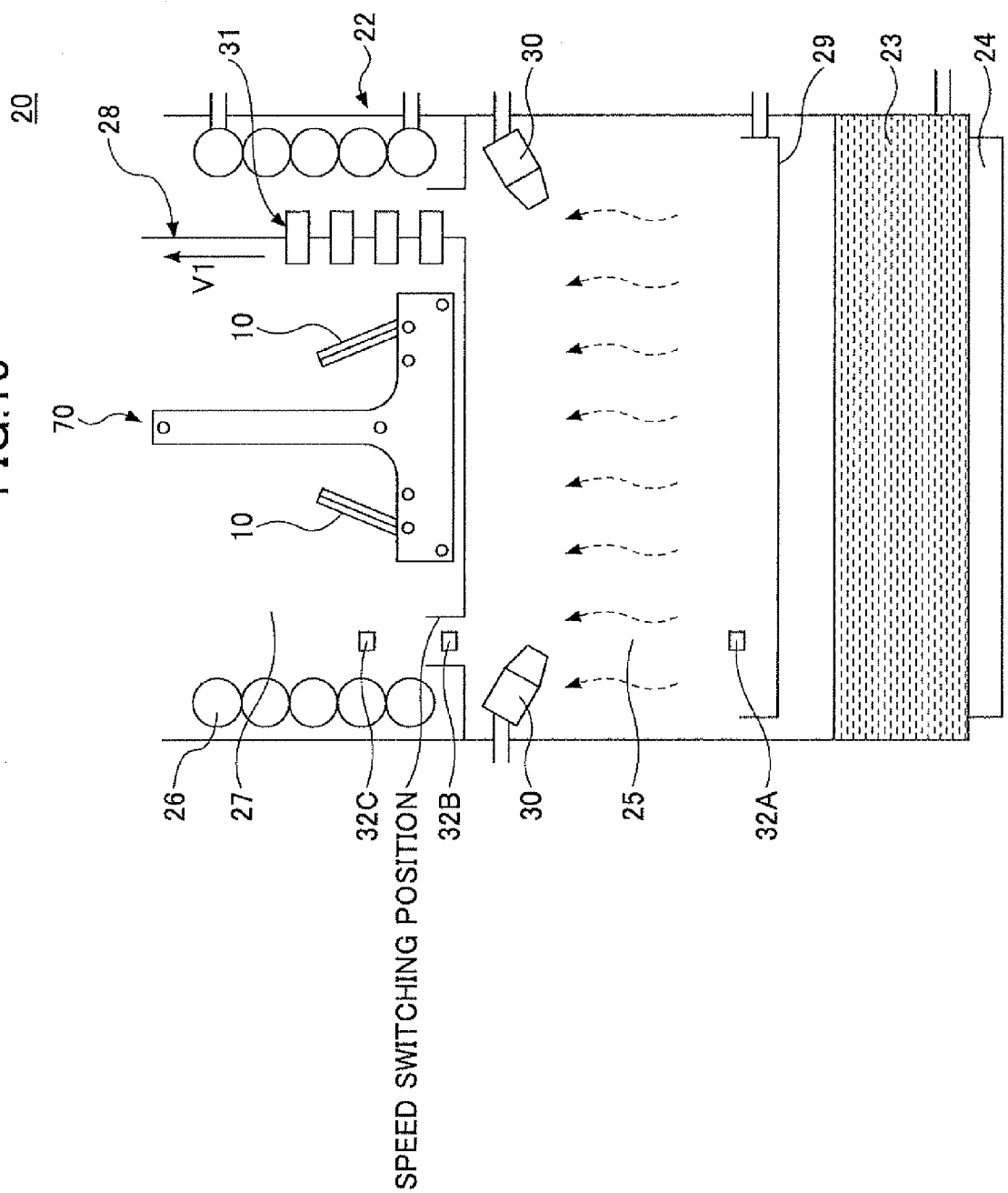
FIG. 15 is a schematic diagram for describing an operation of a cleaning/drying apparatus according to an embodiment of the present invention (Part 5)
Figure 16:
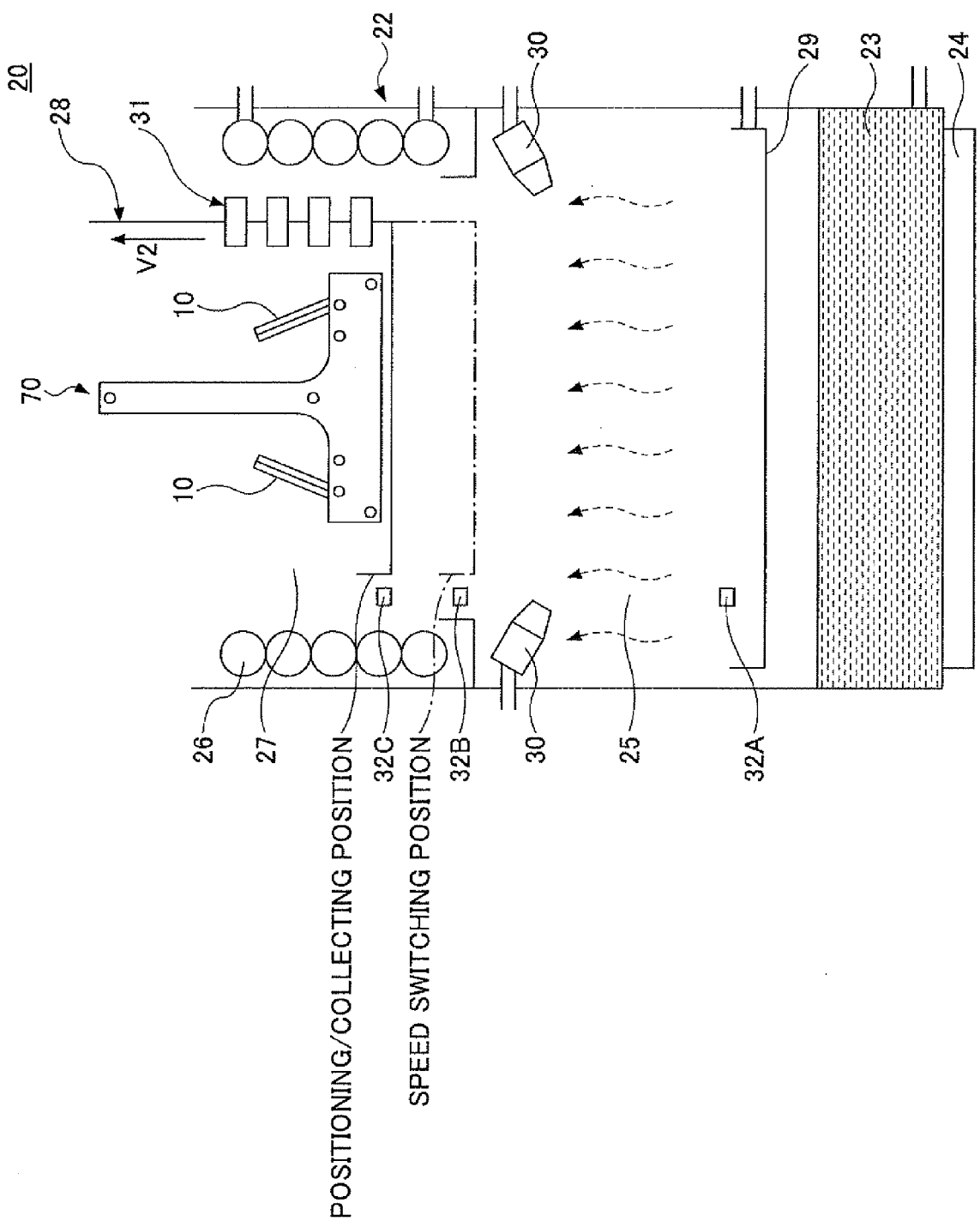
FIG. 16 is a schematic diagram for describing an operation of a cleaning/drying apparatus according to an embodiment of the present invention (Part 6)
Figure 17:
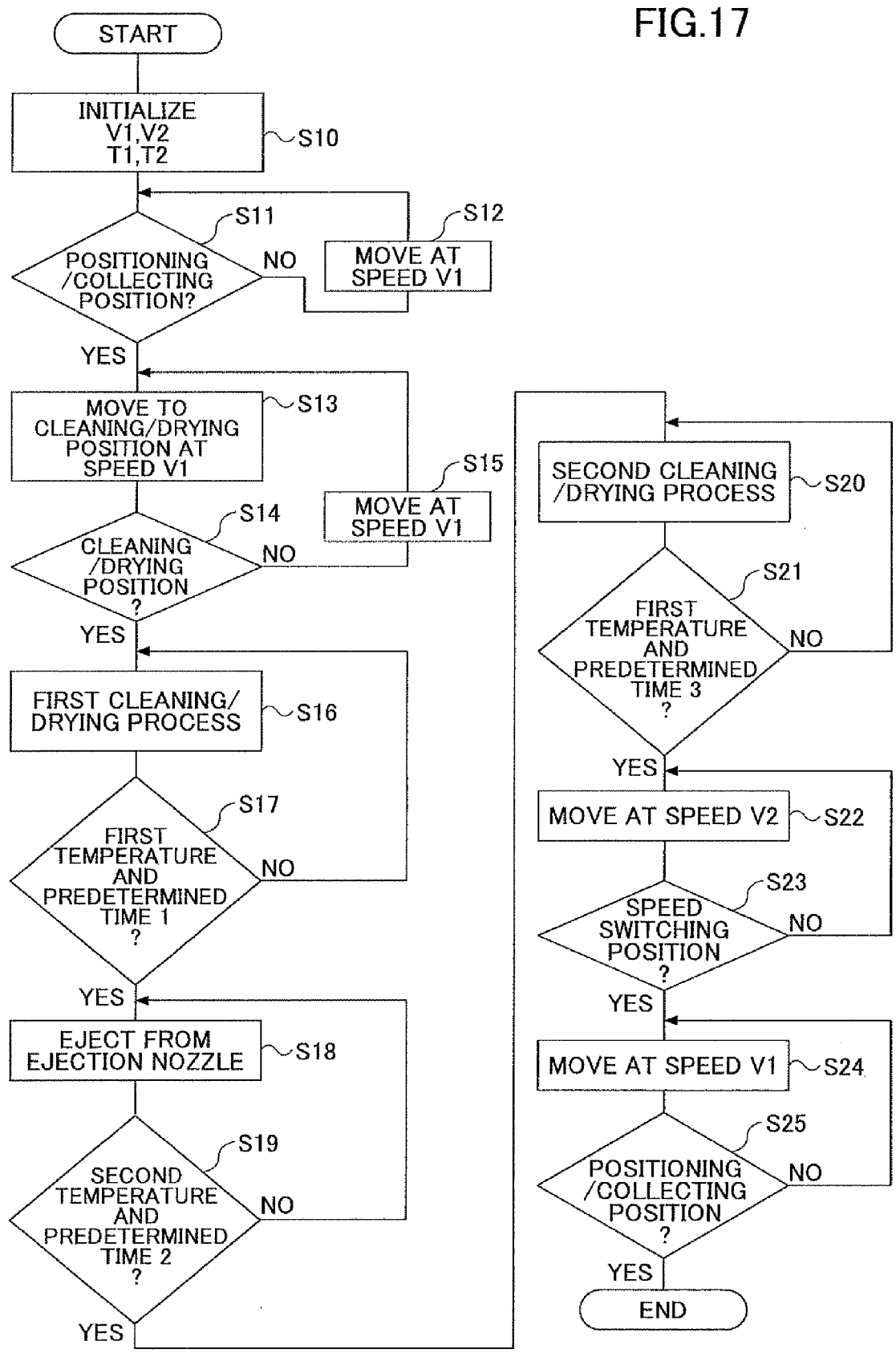
FIG. 17 is a flowchart showing a cleaning/drying process performed by a control apparatus according to an embodiment of the present invention.

Next, operations of the cleaning/drying apparatus 20 during a cleaning/drying process along with a cleaning/drying process conducted (controlled) by the control apparatus 36 are described with reference to FIGS. 11-17. FIGS. 11-16 are schematic diagrams for describing operations of the cleaning/drying apparatus 20 during a cleaning/drying process according to an embodiment of the present invention. FIG. 17 is a flowchart of a cleaning/drying process conducted by the control apparatus 36 according to an embodiment of the present invention. In FIGS. 11-16, like components and parts are denoted with like reference numerals as of those in FIGS. 2-10 and are not further explained.

With reference to FIG. 17, when starting the cleaning/drying process of the cleaning/drying apparatus 20 according to an embodiment of the present invention, the heater 24, the circulation unit 35, the control apparatus 36 are activated together with starting the supply of cooling water to the cooling tubes 26. Then, initialization is performed on the control apparatus 36 (Step S1).

In Step S10, a first speed V1 applied when raising and lowering the elevation stage 28, a second speed V2 applied when raising the elevation stage 28, a first temperature T1 used for determining the timing of starting the ejection of the organic solvent 23 from the ejection nozzle 30, and a second temperature T2 used for determining the timing of stopping the ejection of the organic solvent 23 from the ejection nozzle 30 are set (initialized). The setting (initialization) of the speeds V1, V2, temperatures T1, T2, is performed by using, for example, an input panel 57 and speed input switches 58A, 58B as shown in FIG. 6.

According to this embodiment of the present invention, the first speed V1 is set to 9.5 mm/sec and the second speed V2 is set to 2.5 mm/sec. Furthermore, the first temperature T1 is set with a temperature substantially equal to the temperature inside the vapor area 25. In this embodiment of the present invention, the first temperature T1 is set to 80° C. The second temperature T2 is set with a temperature capable of generating dew (condensation) of the organic solvent 23 on the surface of the installing case 10 (row bar 11) in the vapor area 25. In this embodiment of the present invention, the second temperature T2 is set to 24° C. The settings of the first and second speeds V1, V2 and the first and second temperatures T1, T2 are not limited to those described in this embodiment of the present invention. The settings of the first and second speeds V1, V2 and the first and second temperatures T1, T2 may vary depending on the type of organic solvent 23 being used, the capacity of the cleaning/drying tank 22, and the type or shape of the installing case 10 (row bar 11).

After the initialization of Step 10, the control apparatus 36 moves the elevation stage 28 to a positioning/collecting position. More specifically, the control apparatus 36 detects the current position of the elevation stage 28 according to signals from the position sensors 32A-32C (Step S11). In a case where the elevation stage 28 is not positioned at the positioning/collecting position (No in Step S11), the control apparatus 36 drives the elevation driving apparatus 33 and moves the elevation stage 28 to the positioning/collecting position (Step S12).

Figure 11:
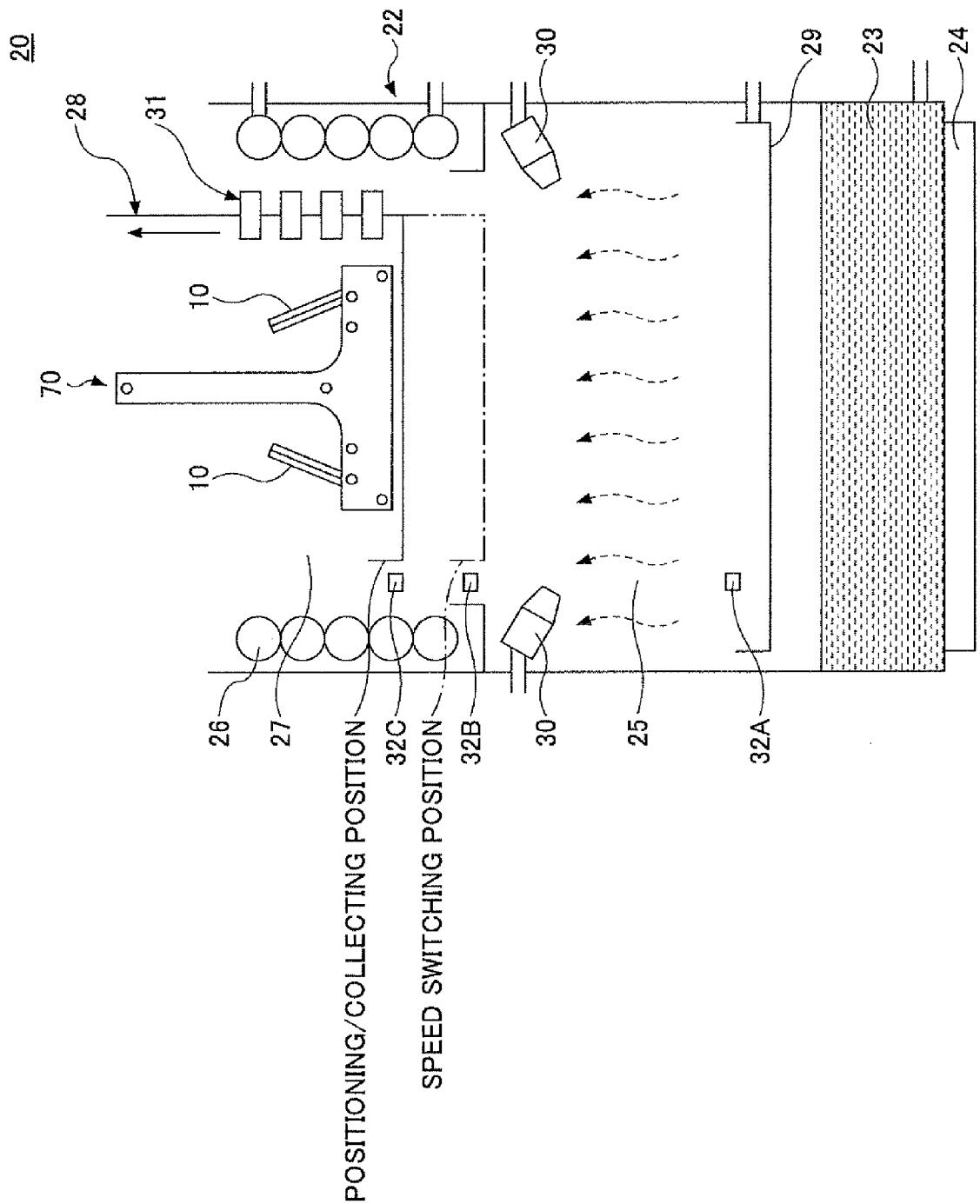
FIG. 11 is a schematic diagram for describing an operation of a cleaning/drying apparatus according to an embodiment of the present invention (Part 1)

When the elevation stage 28 is moved to the positioning/collecting position by the processes in Steps S11 and S12, the installing basket 70 is containing the installing case 10 is mounted to the elevation stage 28. FIG. 11 shows a state where the installing basket 70 is mounted to the elevation stage 28.

When the installing basket 70 is mounted to the elevation stage 28, the control apparatus 36 drives the elevation driving apparatus 33 again and moves the elevation stage 28 to a cleaning/drying position (Step S13). In this example, the elevation stage 28 is lowered at a speed of the first speed V1. The control apparatus 36 continues to lower the elevation stage 28 until the position sensor 32A provided at the cleaning/drying position detects the elevation stage 28 (Steps S14, S15).

Figure 12:
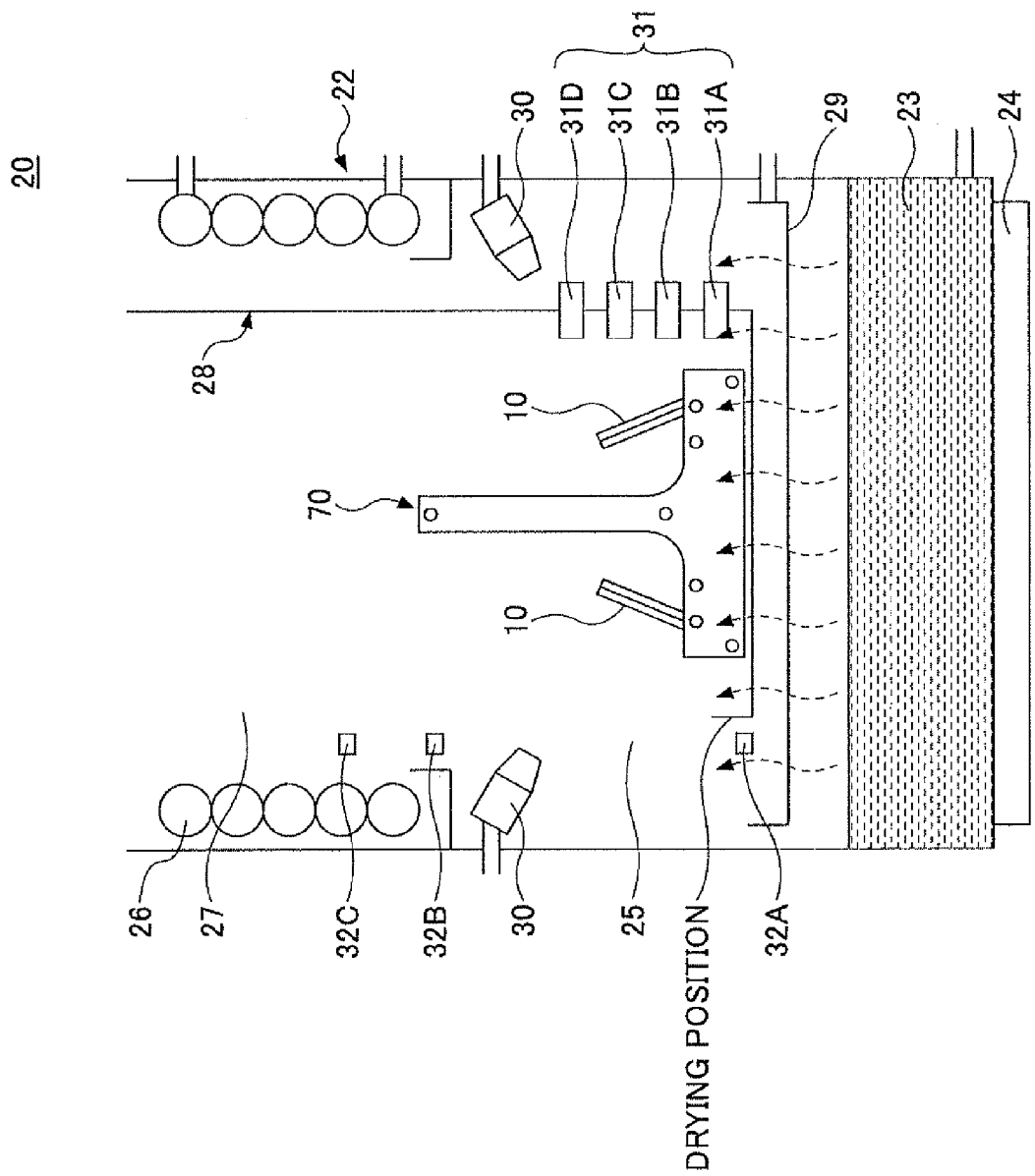
FIG. 12 is a schematic diagram for describing an operation of a cleaning/drying apparatus according to an embodiment of the present invention (Part 2)

When the position sensor 32A detects the elevation stage 28 at the cleaning/drying position, the control apparatus 36 stops the moving of the elevation stage 28. FIG. 12 shows a state where the elevation stage 28 is moved to the cleaning/drying position.

When the elevation stage 28 reaches the cleaning/drying position, the row bar 11 (cleaning/drying target) is positioned (mounted) in the vapor area 25. At this state, a first cleaning/drying process is performed on the row bar 111 (Step S16). At substantially the same time when the elevation stage 28 reaches the cleaning/drying position, the control apparatus 36 starts measuring the time of performing the first cleaning/drying process (hereinafter referred to as "first elapsed time").

In the first cleaning/drying process, the row bar 11, which has just been mounted in the vapor area 25, has a temperature (e.g., 20° C.-25° C.) lower than the temperature inside the vapor area 25 (approximately 80° C.). Therefore, the organic solvent 23 condenses on the surface of the row bar 11. The condensed organic solvent 23 flows off from the surface of the row bar 11 together with stains on the surface of the row bar 11. Thereby, the surface of the row bar 11 is cleaned. As the temperature of the row bar 11 rises along with the elapsing of time, the condensation of the organic solvent 23 becomes less and the organic solvent 23 on the surface of the row bar 11 vaporizes. As a result, the surface of the row bar 11 becomes dry.

In Step S17, the control apparatus 36 determines whether the temperature of the row bar 11 has reached a predetermined first temperature (temperature substantially equal to the temperature inside the vapor area 25) according to the temperature of the row bar 11 (actually, temperature in the vicinity of the row bar 11) detected by the temperature sensors 31A-31D. Together with this temperature determining process, the control apparatus 36 determines whether the first elapsed time (time elapsed after the elevation stage 28 is positioned in the cleaning/drying position) has surpassed a predetermined time 1. The predetermined time 1, which is a time obtained by experimentation, corresponds to the time required for the temperature of the row bar 11 to reach the first temperature after the row bar 11 is positioned in the vapor area 25. In this embodiment of the present invention, the predetermined time 1 is 14 minutes.

In a case where the temperature of the row bar 11 is equal to or less than the first temperature and the first elapsed time is below the predetermined time 1, the first cleaning/drying process of Step S16 is continued.

In a case where the temperature of the row bar 11 is greater than the first temperature and the first elapsed time surpasses the predetermined time 1, the control apparatus 36 opens the valve 44 (see FIG. 4) and starts the ejection of the organic solvent 23 from the ejection nozzles 30 to the row bar 11. At substantially the same time when starting the ejection of the organic solvent 23, the control apparatus 36 starts measuring the time of performing a second cleaning/drying process (hereinafter referred to as "second elapsed time").

Figure 13:
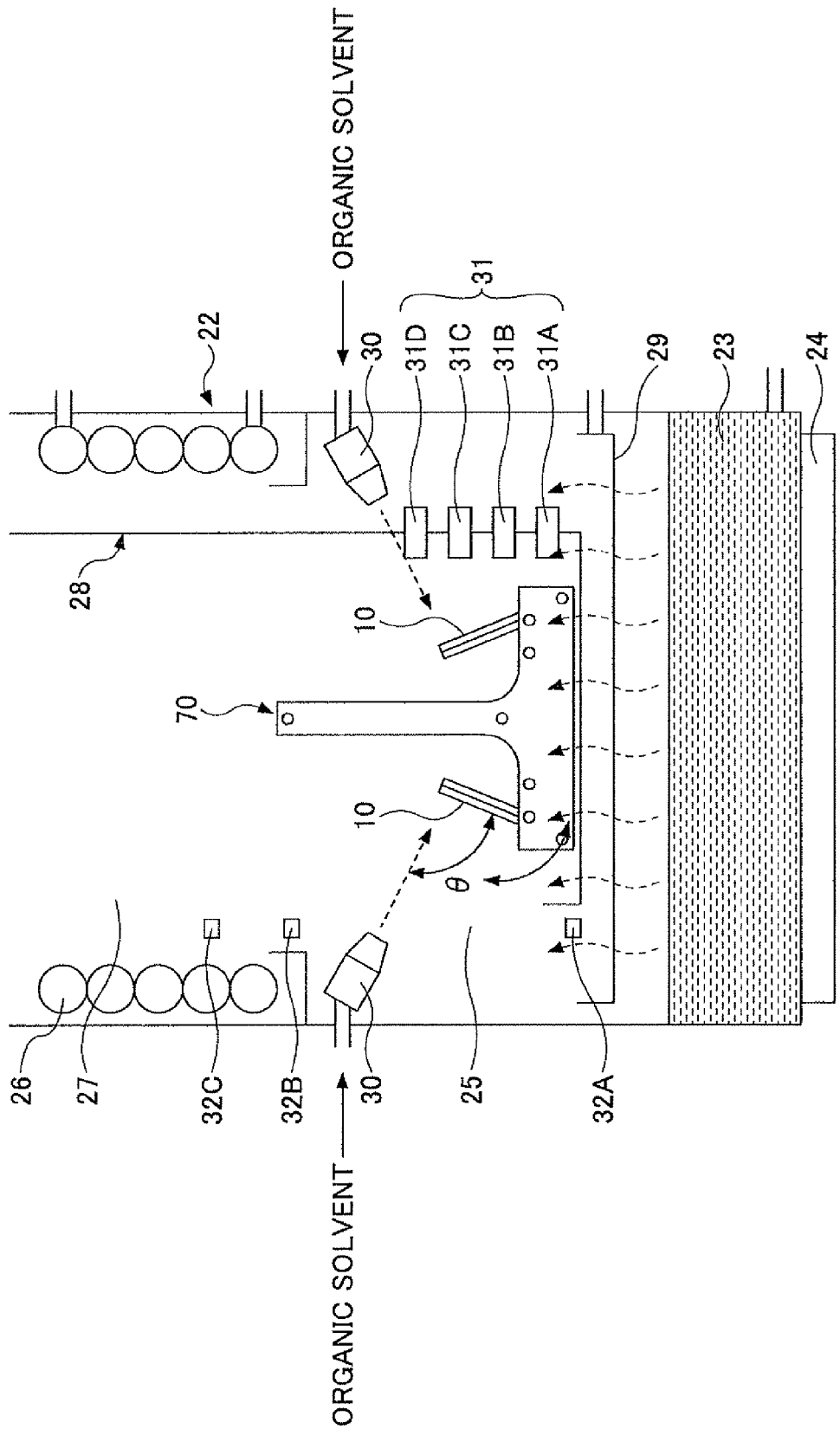
FIG. 13 is a schematic diagram for describing an operation of a cleaning/drying apparatus according to an embodiment of the present invention (Part 3)
Figure 14:
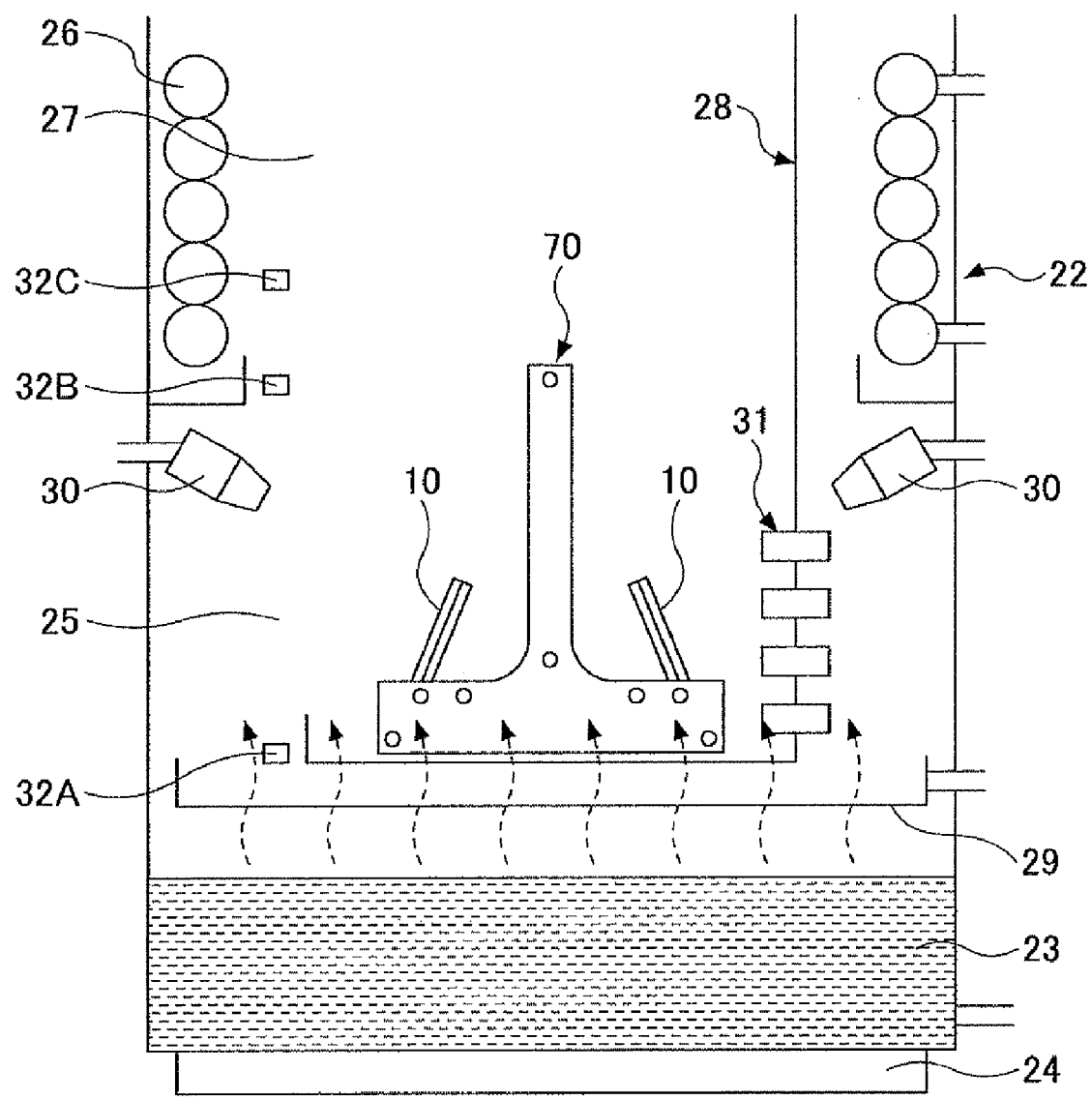
FIG. 14 is a schematic diagram for describing an operation of a cleaning/drying apparatus according to an embodiment of the present invention (Part 4)

FIG. 13 shows a state where the organic solvent 23 is ejected from the ejection nozzles 30 to the installing case 10 (row bar 11) according to an embodiment of the present invention. The organic solvent (e.g., IPA) is ejected from the ejection nozzles 30 at an angle equal to or greater than 90 degrees (angle θ in FIG. 13) with respect to the installing case 10 (row bar 11). The temperature of the organic solvent (e.g., IPA) 23 ejected from the ejection nozzles 30 is controlled to approximately 20° C. The flow rate of the ejected organic solvent 23 is, for example, 1.4 l (liters) per second. In this embodiment of the present invention, the ejection nozzles 30 are configured to rotate (see FIG. 8) and eject the organic solvent 23 to an elliptical-shape area (see FIG. 10). Accordingly, the organic solvent 23 can be efficiently ejected onto the installing case 10 (row bar 11).

By ejecting the organic solvent 23 to the installing case 10 (row bar 11), the surface of the row bar 11 can be cleaned. Furthermore, since the temperature of the ejected organic solvent 23 is approximately 20° C., the row bar 11 (having a temperature of approximately 80° C. at the time when determined as "YES" in Step S17) can be gradually cooled.

In Step S19, the control apparatus 36 determines whether the temperature of the row bar 11 has reached a predetermined second temperature (temperature capable of causing the organic solvent 23 on the surface of the row bar 11 to condense, for example, 24° C.) according to the temperature of the row bar 11 (actually, temperature in the vicinity of the row bar 11) detected by the temperature sensors 31A-31D. Together with this temperature determining process, the control apparatus 36 determines whether the second elapsed time (time of ejecting the organic solvent 23 from the ejection nozzles 30) has surpassed a predetermined time 2. The predetermined time 2, which is a time obtained by experimentation, corresponds to the time required for the temperature of the row bar 11 to reach the second temperature after the ejection by the ejection nozzles 30 is started. In this embodiment of the present invention, the predetermined time 2 is 1 minute.

In this embodiment of the present invention, in a case where the temperature of the row bar 11 is no less than the second temperature (24° C.) and the second elapsed time is below the predetermined time 2, the process of ejecting the organic solvent 23 from the ejection nozzles 30 (Step S18) is continued.

In a case where the temperature of the row bar 11 is less than the second temperature (24° C.) and the second elapsed time is greater than the predetermined time 2, the control apparatus 36 stops the ejection by the ejection nozzles 30 by closing the valve 44.

In the state where the ejection by the ejection nozzles 30 is stopped, the temperature of the row bar 11 is below the second temperature. Thereby, the organic solvent 23 can condense on the surface of the row bar 11. Accordingly, a second cleaning/drying process can be performed on the row bar 11 (Step S20). At substantially the same time when stopping the ejection of the organic solvent 23, the control apparatus 36 starts measuring the time of performing the second cleaning/drying process (hereinafter referred to as "third elapsed time").

The process performed in the second cleaning/drying process of Step S20 is basically the same as those of the first cleaning/drying process of Step S16. That is, the organic solvent 23 condenses on the surface of the row bar 11. The condensed organic solvent 23 flows off from the surface of the row bar 11 together with stains on the surface of the row bar 11. Thereby, the surface of the row bar 11 is cleaned. As the temperature of the row bar 11 rises along with the elapsing of time, the condensation of the organic solvent 23 becomes less and the organic solvent 23 on the surface of the row bar 11 vaporizes. As a result, the surface of the row bar 11 becomes dry.

In Step S21, the control apparatus 36 determines whether the temperature of the row bar 11 has reached a predetermined first temperature (temperature substantially equal to the temperature inside the vapor area 25) according to the temperature of the row bar 11 (actually, temperature in the vicinity of the row bar 11) detected by the temperature sensors 31A-31D. Together with this temperature determining process, the control apparatus 36 determines whether the third elapsed time (time elapsed after the ejection of the organic solvent 23 is stopped) has surpassed a predetermined time 3. The predetermined time 3, which is a time obtained by experimentation, corresponds to the time required for the temperature of the row bar 11 to reach the first temperature after the ejection of the organic solvent 23 is stopped. In this embodiment of the present invention, the predetermined time 3 is 14 minutes.

If the determination in Step S21 is "YES", the control apparatus 36 drives the elevation driving apparatus 33 and raises the elevation stage 28 at a speed of the second speed V2 set in Step S10. The second speed V2 is, for example, 2.5 mm/sec.

The control apparatus 36 determines whether the elevation stage 28 has reached a speed switching position according to signals from the position sensor 32B (Step S23). The control apparatus 36 continues to raise the elevation stage 28 at the second speed V2 until the elevation stage 28 reaches the speed switching position. Then, the control apparatus 36 switches the speed of raising the elevation stage 28 from the second speed V2 to the first speed V1 when the elevation stage 28 reaches the speed switching position (Step S24). The first speed V1 is, for example, 9.5 mm/sec. FIG. 15 shows a state where the raised elevation stage 28 has reached the speed switching position.

Then, the control apparatus 36 raises the elevation stage 28 at the first speed V1 until the elevation stage 28 reaches the positioning/collecting position. The entire cleaning/drying process is completed when the elevation stage 28 reaches the positioning/collecting position. FIG. 16 shows a state where the elevation stage 28 has returned to the positioning/collecting position.

FIG. 18 is a table showing experiment results regarding the cleaning performance (cleaning effect) of the cleaning/drying apparatus 20 according to an embodiment of the present invention in comparison with a vapor drying apparatus 1 according to a related art example. In the experiment of FIG. 18, a cleaning/drying process is performed on a 5 inch silicon wafer by using the cleaning/drying apparatus 20 and the vapor drying apparatus 1. Then, a contamination count of 0.2 µm or more on the wafer surface is measured by using a particle counter. As shown in FIG. 18, the cleaning/drying apparatus 20 according to an embodiment of the present invention exhibits less contamination compared to that of the related art example. This shows that cleaning and drying quality can be improved with the cleaning/drying apparatus 20 according to an embodiment of the present invention than that of the related art example.

In the above-described embodiment of the first cleaning/drying process of Step S16, the cleaning process by ejecting the organic solvent of Step S18, and the second cleaning/drying process of Step S20 are performed once, respectively. However, the first and second cleaning/drying processes of Steps S16, S20 or the cleaning process of Step S18 may be performed repetitively. By performing the processes repetitively, cleaning/drying performance can be improved.

Furthermore, although the organic solvent ejecting process of Step S18 is performed after the first cleaning/drying process of Step S16 in the above-described embodiment of the present invention, the first cleaning/drying process may be performed after the organic solvent ejecting process.

Further, the present invention is not limited to these embodiments, but variations and modifications may be made without departing from the scope of the present invention.

For example, the above-described embodiment of the present invention is not only applicable to cleaning and drying of magnetic heads, but may also be applied to other electronic components and devices requiring high precision processing, such as a semiconductor wafer, a glass substrate for liquid crystal display apparatuses, an optical recording disk, or a magnetic recording disk.

The present application is based on Japanese Priority Application No. 2007-258077 filed on Oct. 1, 2007, with the Japanese Patent Office, the entire contents of which are hereby incorporated herein by reference.

What is claimed is:

1. A cleaning/drying apparatus comprising:
 a vapor area where vapor of an organic solvent inside the cleaning/drying apparatus is generated;
 an ejecting part configured to eject the organic solvent onto a cleaning/drying target;
 a first detecting part configured to determine whether the temperature of the cleaning/drying target is a first temperature equivalent to a temperature of the vapor in the vapor area;
 a second detecting part configured to determine whether the temperature of the cleaning/drying target is a second temperature enabling the organic solvent to condense on a surface of the cleaning/drying target; and
 a cleaning/drying control part configured to drive the ejecting part to eject the organic solvent when the first detecting part detects that the temperature of the cleaning/drying target is the first temperature and stop the ejection when the second detecting part detects that the temperature of the cleaning/drying target is the second temperature.

2. The cleaning/drying apparatus as claimed in claim 1, wherein the first detecting part is configured to measure an elapsed time after the cleaning/drying target is positioned in the vapor area, wherein the first detecting part determines that the temperature of the cleaning/drying target is the first temperature when the elapsed time is a predetermined time for the temperature of the cleaning/drying target to reach the first temperature.

3. The cleaning/drying apparatus as claimed in claim 1, wherein the first detecting part includes at least one temperature sensor provided in a vicinity of a stage on which the cleaning/drying target is mounted when the cleaning/drying target is positioned in the vapor area, wherein the sensor is configured to detect the temperature of the cleaning/drying target.

4. The cleaning/drying apparatus as claimed in claim 1, wherein the second detecting part is configured to measure an elapsed time after the cleaning/drying target is positioned in the vapor area, wherein the first detecting part determines that the temperature of the cleaning/drying target is the first temperature when the elapsed time is a predetermined time for the temperature of the cleaning/drying target to reach the second temperature.

5. The cleaning/drying apparatus as claimed in claim 1, wherein the second detecting part includes at least one temperature sensor provided in a vicinity of a stage on which the cleaning/drying target is mounted when the cleaning/drying target is positioned in the vapor area, wherein the sensor is configured to detect the temperature of the cleaning/drying target.

6. The cleaning/drying apparatus as claimed in claim 1, wherein the ejecting part includes a movable ejection nozzle configured to move a position for ejecting the organic solvent.

7. The cleaning/drying apparatus as claimed in claim 1, further comprising:
 a stage to which the cleaning/drying target is mounted when the cleaning/drying target is positioned in the vapor area;
 an elevating part for raising and lowering the stage;
 wherein the cleaning/drying target is positioned in the vapor area or removed from the vapor area by raising or lowering the stage with the elevating part.

8. The cleaning/drying apparatus as claimed in claim 7, wherein the cleaning/drying control part is configured to control the speed of raising the stage at a first speed when the cleaning/drying target is inside the vapor area and control the speed of raising the stage at a second speed faster than the first speed after the cleaning/drying target is moved outside the vapor area.

9. The cleaning/drying apparatus as claimed in claim 1, wherein the stage has a basket mounted thereon for mounting the cleaning/drying target.

* * * * *